United States Patent
Kato (10) Patent No.: US 7,023,599 B2
(45) Date of Patent: Apr. 4, 2006

(54) OPTICAL MODULATOR EXCITING CIRCUIT

(75) Inventor: Tomoaki Kato, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/507,246

(22) PCT Filed: Mar. 10, 2003

(86) PCT No.: PCT/JP03/02778

§ 371 (c)(1),
(2), (4) Date: Sep. 10, 2004

(87) PCT Pub. No.: WO03/077014

PCT Pub. Date: Sep. 18, 2003

(65) Prior Publication Data

US 2005/0146766 A1 Jul. 7, 2005

(30) Foreign Application Priority Data

Mar. 12, 2002 (JP) .............................. 2002-066620

(51) Int. Cl.
G02F 1/00 (2006.01)
G02B 26/00 (2006.01)

(52) U.S. Cl. ...................................... 359/237; 359/254
(58) Field of Classification Search ................. 359/237
See application file for complete search history.

(56) References Cited

FOREIGN PATENT DOCUMENTS

| JP | H07-234390 A | 9/1995 |
|----|--------------|--------|
| JP | H09-181682 A | 7/1997 |
| JP | H11-24018 A  | 1/1999 |
| JP | H11-38372 A  | 2/1999 |
| JP | 2000-19473 A | 1/2000 |
| JP | 2001-154161 A | 6/2001 |
| JP | 2001-209017 A | 8/2001 |

Primary Examiner—Ricky L. Mack
Assistant Examiner—Richard Hanig
(74) Attorney, Agent, or Firm—Sughrue Mion, PLLC (57) ABSTRACT

A circuit for exciting an optical modulator, in accordance with the present invention, includes an optical modulator for modulating an optical signal, a first strip line electrically connected to the optical modulator and directing a modulation RF signal to the optical modulator, and a second strip line electrically connected to the first strip line through the optical modulator. The first strip line includes a first electrical device and has a first characteristic impedance, the second strip line includes a second electrical device and has a second characteristic impedance, the first characteristic impedance is equal to a characteristic impedance of a path through which the modulation RF signal is input into the first strip line, and a parallel-combined impedance of the first and second electrical devices is equal to the characteristic impedance of the path.

12 Claims, 7 Drawing Sheets

PRIOR ART

OPTICAL MODULATOR EXCITING CIRCUIT

BACKGROUND OF THE INVENTION

1. Field of the Invention

The invention relates to a circuit for launching a modulation signal to an optical modulator which, modulates an optical signal, an optical modulator module including a circuit for launching a modulation signal to an optical modulator, and a method of launching a modulation signal to an optical modulator which modulates an optical signal.

2. Description of the Related Art

With significant increase in demand for broad-band multimedia communication services such as Internet, it is now required to develop an optical-fiber communication system having a greater capacity and being able to accomplish higher performance. In addition, with increase in a scale of an optical-fiber communication system, the number of optical communication modules used in an optical-fiber communication system is increasing.

For the reasons mentioned above, a cost and a load of assembly, as well as a size, of an optical communication module used in an optical-fiber communication system are not ignorable in an optical-fiber communication system. Thus, it is now quite important to fabricate an optical communication module in a smaller size, under higher integration of functions, and in smaller costs.

As one of solutions of fabricating an optical-fiber communication system in a smaller size and reducing the number of parts of an optical-fiber communication system, time-multiplicity of data may be increased to increase data-transmission capacity per one wavelength channel. In order to accomplish the solution, an optical communication device associated with high-speed modulation is presently researched and developed.

On the other hand, if data-transmission data per one wavelength channel is increased, wavelength dispersion inherent to an optical fiber path exerts non-ignorable influence on an optical waveform found after long distance transmission. This is because when optical intensity modulation is applied to a light source device, phase modulation (or frequency modulation), though it is quite small, is also applied to the light source device. Such phenomenon is called "wavelength chirping", and exerts serious influence on long-distance transmission characteristic if a transmission rate is over 2.5 Gb/s per a channel. Hence, an external modulation system in which wavelength chirping is small is mainly applied to an optical-fiber communication system acting as a trunk line. Further developed now for an external modulation system are a single optical-intensity modulator making use of electroabsorption effect of chemical compound semiconductor, a light source including a single optical-intensity modulator and a light source device such as a DFB laser both integrated together in monolithic.

Presently, an optical-fiber communication system having a transmission rate in the range of 2.5 Gb/s and 10 Gb/s per a channel has been already in practice use. There are now developed a ultra-high-speed electroabsorption type optical modulator, an integrated light source used for the optical modulator, and a pigtailed module including them, in order to accomplish a high transmission rate over 40 Gb/s per a channel.

Figure 7:
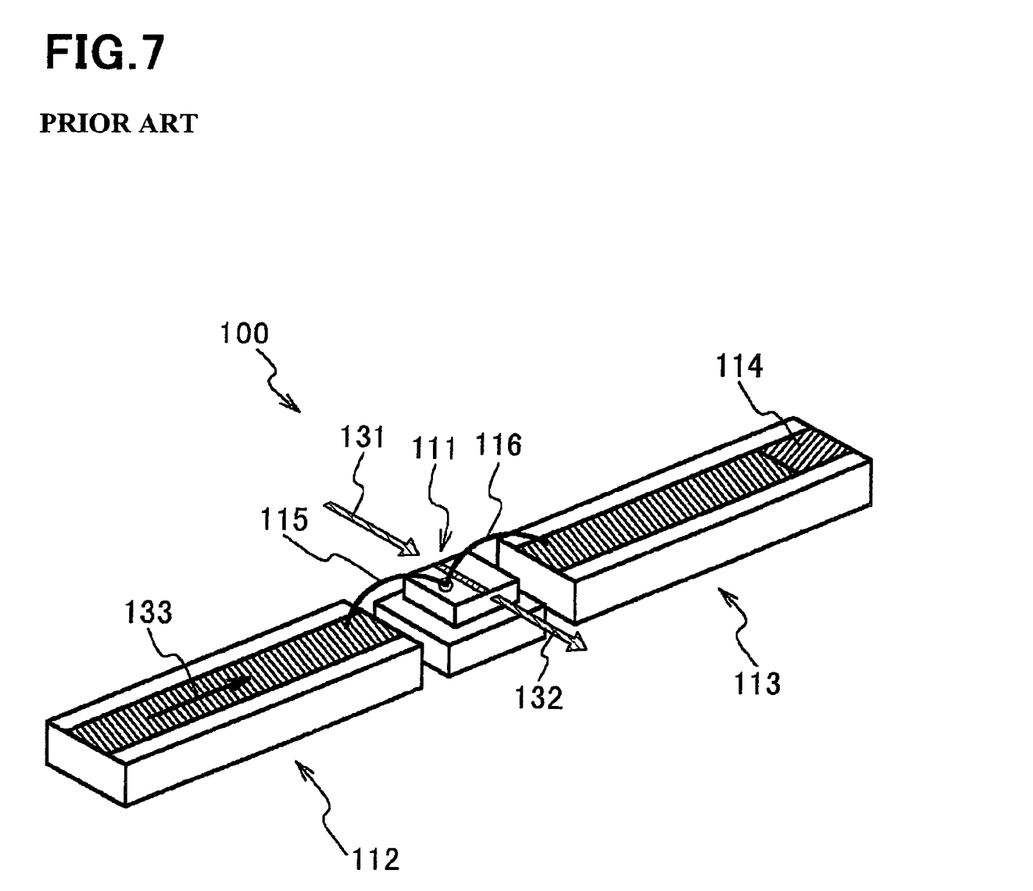
FIG. 7 is a perspective view of a conventional circuit for exciting an optical modulator.

Such an exciter for launching a modulation signal as illustrated in FIG. 7 is often used for integrating an electroabsorption type optical modulator and a modulator-integrated light source. FIG. 7 is a schematic of a conventional circuit 100 for launching a modulation signal to an optical modulator.

The circuit 100 for launching a modulation signal to an optical modulator is comprised of an optical modulator 111, a first stripline 112, a second stripline 113 having a terminator 114, a first bonding wire 115 connecting the optical modulator 111 and the first stripline 112 to each other, and a second boding wire 116 connecting the optical modulator 111 and the second stripline 113 to each other.

The first and second striplines 112 and 113 are arranged sandwiching the optical modulator 111 therebetween in a line in a direction perpendicular to a direction in which an optical signal 131 propagates. The optical signal 131 is coupled into the optical modulator 111, and modulated into a second optical signal 312 in the optical modulator 111 in accordance with a modulation signal 133 output from the first stripline 112.

The circuit 100 can control modulation bandwidth by changing an inductance of the first and second bonding wires 115 and 116. However, the circuit 100 is accompanied with a serious problem that the reflection $S_{11}$ (see later mentioned FIG. 5) of the circuit 100 is significantly increased in a high-frequency band close to a millimeter wave band and above. This is due to the following two reasons.

The first reason is as follows. A susceptance of the optical modulator 111 acting as if it is a capacitor, when reverse-biased, is equal to zero (open-circuit) in the vicinity of a direct current. However, the susceptance increases up to almost the same level as characteristic admittance of the first and second striplines 112 and 113 in a high band, and hence, turned into a low impedance (a load almost equal to short-circuit).

The second reason is as follows. A load reflecting the second boding wire 116 and subsequent parts becomes a high impedance in the range of a resonance frequency, defined based on both an inductance of the second bonding wire 116 connecting the optical modulator 111 and the second stripline 113 each other, and a capacitance of an optical absorption layer of the optical modulator 111, and a high frequency. Accordingly, the terminator 114 is unlikely to effectively work.

Since an absolute value of the reflection may exceed −10 dB (10% of a modulation RF signal input power), it would be unavoidable that the optical modulator 111 would have much burden, or unnecessary resonance might be found in modulation frequency characteristics.

As a solution to those problems, arrangement of a fixed attenuator in a stage prior to a module for damping a reflection wave to a certain level or below is considered to be the easiest. However, it is difficult to accomplish a broad band and high output both required in such a driver circuit especially for a 40 Gb/s band. Thus, this solution cannot be adopted, because the solution causes a burden with a driver circuit.

For the purpose of improving such impedance mismatching, a strip-line based stub circuit having open or short-circuited ends are often used. However, such stubs can compensate such an impedance mismatch of a load at only a particular frequency, so that it is not suitable for achieving broad-band matching in the range of direct current to millimeter wave. In addition, a stub may not be suitable as such matching circuit which should be deployed in a package having limited dimensions like the optical modulator module from the viewpoints of module design and assembly.

However, since there are no effective solutions other than the above-mentioned solutions, an optical modulator module and a modulator-integrated light source, both of which are still used, though the above-mentioned problems remain unsolved and intensive reflection is not solved.

For instance, Japanese Patent Application Publication No. 2001-209017 has suggested a photoelectric-transfer semiconductor device which carries out impedance-matching in a broad band to provide a high photoelectric frequency. The suggested photoelectric-transfer semiconductor device is comprised of a semiconductor element, a high-frequency electric signal circuit, a circuit for matching resistors, and a circuit for matching capacitors. The semiconductor element carries out photoelectric transfer. The high-frequency electric signal circuit has ends located in the vicinity of the semiconductor element. Among the ends, an end located closest to an electric-signal terminal of the semiconductor element is electrically connected to the electric-signal terminal through an electrical conductor. The circuit for matching resistors is electrically connected at one end to the electric-signal terminal of the semiconductor element through an electrical conductor, and is grounded at the other end. The circuit for matching capacitors is electrically connected to an end of the high-frequency electric signal circuit, and has such an impedance that an impedance at the side of the semiconductor element when viewed from the end is equal to a standardized impedance of the circuit for matching resistors.

Japanese Patent Application Publication No. 2001-154161 has suggested a semiconductor device which allows photo carriers having been generated in the device to sweep out therefrom. The suggested semiconductor device is comprised of a semiconductor element, and a short-circuit element. The semiconductor element is comprised of a semiconductor layer receiving an optical high-frequency signal having a particular frequency, and generating photo carriers, and an output electrode which outputs the photo carriers as high-frequency. The short-circuit element is electrically connected to the output electrode, and keeps the output electrode grounded for the high-frequency.

Japanese Patent Application Publication No. 2000-19473 has suggested a structure of an optical modulator module for using a microstrip line having a small space in which a transmission line is to be fabricated. The suggested structure is comprised of an optical device, a carrier, an optical fiber, a high-frequency terminal, a thermoelectric cooler, a dielectric substrate, and a package. The carrier has electrical conductivity, and the optical device is mounted on the carrier. An optical signal is input into and output from the optical device by the optical fibers. The high-frequency terminal provides an electric high-frequency signal. The thermoelectric cooler keeps the optical device at a constant temperature. A microstrip line is formed on the dielectric substrate. The package holds the above-mentioned parts in it. The package has the high-frequency terminal and a coplanar waveguide. The dielectric substrate is mounted on the carrier. The carrier is exposed at an end thereof closer to the high-frequency terminal. The exposed portion of the carrier, a ground of the coplanar waveguide, the microstrip line, and a signal area of the coplanar waveguide are connected to one another with the bonding wires.

However, the above-mentioned problem of the reflection remains unsolved even in the above-mentioned photoelectric-transfer semiconductor device and the structure of an optical modulator module.

Accordingly, it is an object of the present invention to provide a circuit for launching a modulation signal to an optical modulator, the circuit being capable of suppressing significant increase in reflection particularly in a high-frequency band in which a maximum frequency of a modulation RF signal reaches a millimeter wave band, when an optical modulator and an optical modulator module on which an optical modulator is integrated are modulated at a high-speed.

It is also an object of the present invention to provide a circuit for launching a modulation signal to an optical modulator, which is capable of suppressing significant increase in the above-mentioned reflection without deteriorating a modulation frequency band.

It is further an object of the present invention to provide a circuit for launching a modulation signal to an optical modulator, which is capable of suppressing significant increase in the above-mentioned reflection without necessity of changing circuit elements, parts and a method of fabricating them.

It is further an object of the present invention to provide a circuit for launching a modulation signal to an optical modulator which is most suitable for accomplishing a broader band of an optical modulator module including an optical modulator and a device in which the optical modulator is integrated, driving the optical modulator module at a lower voltage, fabricating the optical modulator module at lower costs, and accomplishing mass production of the optical modulator module.

It is further an object of the present invention to provide an optical modulator module including the above-mentioned circuit for launching a modulation signal to an optical modulator, and a method of launching a modulation signal to an optical modulator, which provides the same advantages as the advantages provided by the above-mentioned circuit for launching a modulation signal to an optical modulator.

SUMMARY OF THE INVENTION

In order to accomplish the above-mentioned object, the present invention provides a circuit for launching a modulation signal to an optical modulator, including an optical modulator for modulating an optical signal, a first stripline electrically connected to the optical modulator and directing a modulation RF signal to the optical modulator, and a second stripline electrically connected to the first stripline through the optical modulator, characterized in that the first stripline includes a first electrical device and has a first characteristic impedance, the second stripline includes a second electrical device and has a second characteristic impedance, the first characteristic impedance is equal to a characteristic impedance of a path through which the modulation RF signal is input into the first stripline, and a parallel-combined impedance of the first and second electrical devices is equal to the characteristic impedance of the path.

The second electrical device may be comprised of at least two electrical devices, in which case, it is preferable that the at least two electrical devices are arranged at different locations from each other in a length-wise direction of the second stripline.

As an alternative, the at least two electrical devices may be arranged at opposite ends of the second stripline.

At least one of the first and second electrical devices may be comprised of a resistor, for instance.

The resistor may be comprised of a thin-film resistor formed on an electrical conductor of the second stripline.

It is preferable that the second stripline has an electrical length equal to or smaller than a quarter of a wavelength associated with a maximum frequency of the modulation RF signal.

The second characteristic impedance may be designed to be equal to the first characteristic impedance. However, it is preferable that the second characteristic impedance is different from the first characteristic impedance.

The first electrical device may be designed to have an impedance equal to the first characteristic impedance. However, it is preferable that the first electrical device has an impedance different from the first characteristic impedance.

The present invention further provides an optical modulator module including a high-frequency input section for receiving a modulation RF signal by which an optical signal is modulated, an optical input section for receiving a first optical signal, a circuit for launching a modulation signal to an optical modulator, electrically connected to the high-frequency input section and optically connected to the optical input section, the circuit modulating the first optical signal into a second optical signal in accordance with the modulation RF signal, the circuit being comprised of a circuit defined in any one of claims 1 to 8, and an optical output section optically connected to the circuit and outputting the second optical signal.

The optical input section may be comprised of an optical input terminal through which an optical signal is input and output, and a first lens, in which case, the optical input terminal is connected to a first optical fiber, receives the first optical signal through the first optical fiber, and outputs the first optical signal to the first lens, and the first lens receives the first optical signal and outputs the first optical signal to the optical modulator of the circuit.

The optical output section may be comprised of a second lens, and an optical output terminal through which an optical signal is input and output, in which case, the second lens receives the second optical signal from the optical modulator of the circuit, and outputs the second optical signal to the optical output terminal, and the optical output terminal is connected to a second optical fiber, receives the second optical signal through the second lens, and outputs the second optical signal to the second optical fiber.

The present invention further provides a method of launching a modulation signal to an optical modulator, including outputting a modulation RF signal to an optical modulator through a first stripline including a first electrical device and having a first characteristic impedance, modulating a first optical signal into a second optical signal in the optical modulator in accordance with the modulation RF signal, and outputting the modulation RF signal through the optical modulator to a second stripline including a second electrical device and having a second characteristic impedance, wherein the first characteristic impedance is equal to a characteristic impedance of a path through which the modulation RF signal is input into the first stripline, and a parallel-combined impedance of the first and second electrical devices is equal to the characteristic impedance of the path.

The circuit for launching a modulation signal to an optical modulator in accordance with the present invention provides super characteristics in a broad-band characteristic and a low-reflection characteristic when an optical modulator is excited in accordance with a modulation RF signal.

That is, the circuit for launching a modulation signal to an optical modulator in accordance with the present invention suppresses the behavior of an optical modulator as a capacitive load as much as possible by optimizing a stripline in an optical modulator module including an optical modulator and an optical element in which the optical modulator is integrated. In addition, the circuit in accordance with the present invention minimizes an influence exerted on a modulation frequency band, and lowers reflection for the circuit down to a target level.

Specifically, in the circuit for launching a modulation signal to an optical modulator in accordance with the present invention, terminator resistors of an existing optical modulator module are arranged in the circuit in dispersion. As a result, it would be possible to lower the reflection characteristic of the circuit for launching a modulation signal to an optical modulator, to a practically ignorable level. It is possible to do so by making use of a conventional apparatus for fabricating the circuit, a conventional method of doing the same, and a conventional process of assembling a module without any additional circuit elements and parts.

The arrangement of terminator resistors in dispersion in dispersion can be summarized as follows.

(1) A susceptance of an optical modulator element is matched with a load having a sign opposite to the sign of the susceptance.

(2) As a load used for the matching, the second stripline is designed to have terminator resistors at opposite ends thereof. A matching circuit is comprised of the second stripline having terminator resistors at opposite ends thereof, and an optical modulator element electrically connected in parallel to the second stripline.

A structure of forming terminator resistors at opposite ends of the second stripline constitutes a stub having terminated opposite ends, unlike a conventional stub. The reason for not using a conventional open or short-circuited stub as a circuit for matching a micro wave and millimeter wave band is that since an impedance of the open or short-circuited stub significantly varies together with a frequency, the open or short-circuited stub is not suitable for impedance-matching of an optical modulator element acting as a capacitive load.

It is possible to independently optimize upper and lower limits of an impedance of a requisite matching circuit by varying a ratio between a characteristic impedance and a terminator resistance in the second stripline. The terminators formed at opposite ends of the second stripline acts as a dumping resistor for suppressing unnecessary multiple reflections occurring between discontinuous sections of a line formed in a circuit for launching a modulation signal to an optical modulator. The terminators attenuate unnecessary reflected waves, and effectively suppress an influence exerted by unnecessary resonance on modulation frequency characteristic.

(3) The second stripline is designed to have an electric length equal to or smaller than a quarter of a wavelength of an input modulation RF signal.

A matching band is almost dependent on a length of the second stripline. It is now assumed that a second stripline has a length equal to or smaller than a quarter of a wavelength $\lambda$ of an input modulation RF signal, wherein primary approximation is established for the wavelength $\lambda$, when Taylor development is applied to an admittance of the second stripline. Under the assumption, it is possible to consider the second stripline and the terminator resistors as a matching circuit which shows a tendency that an admittance is reduced (or an impedance is increased) in proportion with a frequency.

The behavior of the second stripline and the terminator resistors cancel the behavior of a capacitive load such as an optical modulator element which is simply dependent on a frequency (that is, an impedance is reduced). Since the behavior of the second stripline and the terminator resistors meet with the requirement set forth in (1), and hence, they are suitable for accomplishing a broader band.

(4) A parallel-combined resistance of the terminators arranged in dispersion in the first and second striplines is set equal to a characteristic impedance of a line through which a modulation RF signal is input.

In a low-frequency band close to a direct current, an impedance of an optical modulator element is almost indefinite (open-circuit), and a load of a circuit for launching a modulation signal to an optical modulator is almost equal to a parallel-combined resistance of the terminators arranged in dispersion. Hence, if the terminators of the first and second striplines are selected so that the load is equal to a characteristic impedance of a line through which a modulation RF signal is input, it would be possible to suppress the reflection of a circuit for launching a modulation signal to an optical modulator, down to a practically ignorable level.

In general, it is not easy to optimize parameters of circuit elements of a matching circuit due to dependency of an impedance of an element to be matched, on a frequency. However, the circuit for launching a modulation signal to an optical modulator in accordance with the present invention makes it possible to almost independently optimize upper and lower limits of an absolute value of an impedance of a matching circuit by varying a length of the second stripline for controlling the dependency of a matching circuit on a frequency, based on the characteristic set forth in (3), and further by controlling a ratio between a characteristic impedance and resistances of resistors formed at opposite ends in the second stripline.

In other words, since an admittance tends to decrease (or an impedance tends to increase) in proportion to a frequency of a modulation RF signal in a matching circuit, it would be possible to control increase and decrease of a range or a band in which a frequency is matched, and a degree at which a range or a band in which a frequency is matched is increased or decreased.

Furthermore, it is possible to control an upper limit of an absolute value of an impedance of a matching circuit by controlling a ratio between a characteristic impedance of the second stripline and a resistance of resistors formed at opposite ends of the second stripline.

Similarly, it is possible to control a lower limit of an absolute value of an impedance of a matching circuit by controlling a ratio between a characteristic impedance of the second stripline and a resistance of resistors formed at opposite ends of the second stripline.

In addition, it is possible to optimize the above-mentioned upper and lower limits independently of each other.

The present invention makes it possible to solve a problem that the reflection is significantly increased in a high-frequency band when an optical modulator and an optical modulator module in which the optical modulator is integrated are modulated at a high-speed, and hence, accomplishes reduction in reflection in a broad band in the range of a direct current and a millimeter wave band which are required for an optical-fiber communication system. Thus, it is possible to reduce a burden exerted on a circuit for driving an optical modulator module, and further reduce a harmful influence exerted on a modulation signal, caused by unnecessary resonance.

Furthermore, the present invention does not degrade a modulation frequency band, and provides superior broad-band and low-reflection modulation characteristic.

In fabrication of a circuit for launching a modulation signal to an optical modulator in accordance with the present invention, a minimum change, specifically, addition of a thin-film resistor is applied to a stripline of a conventional circuit for launching a modulation signal to an optical modulator. That is, conventional process and equipments for fabricating the circuit can be used without any changes except that a mask pattern for fabricating a thin-film resistor is partially revised. Thus, it is possible to have an optical modulator module had high performance without any additional costs, enhancement in performance, enhancement in productivity and reduction in costs can be expected. As a result, it is possible for an optical-fiber communication system acting as a trunk line to operate at a higher rate and to present high performances, for construction of a next-generation communication network.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A circuit for launching a modulation signal to an optical modulator and an optical modulator module in accordance with the preferred embodiments of the present invention are explained hereinbelow with reference to drawings.

First, a circuit for launching a modulation signal to an optical modulator in accordance with the first embodiment of the present invention is explained hereinbelow.

Figure 1:
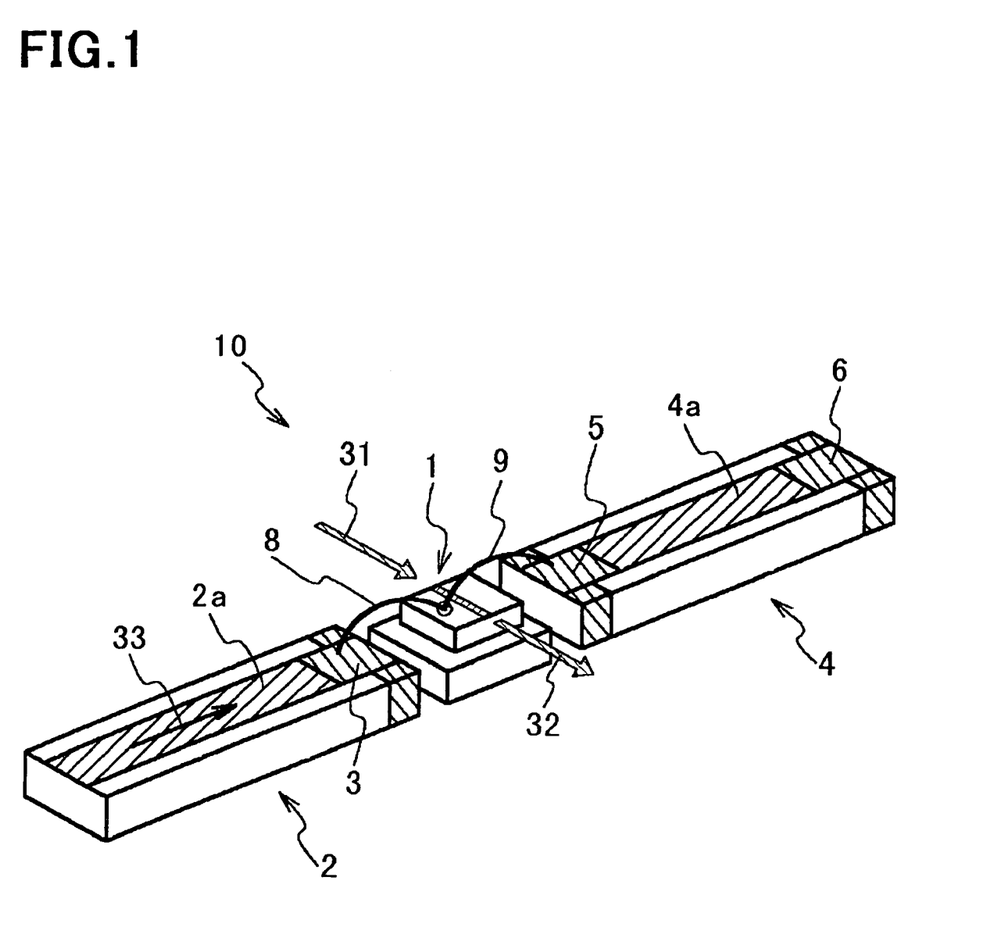
FIG. 1 is a perspective view of a circuit for exciting an optical modulator in accordance with the first embodiment of the present invention.

FIG. 1 is a perspective view of the circuit 10 for launching a modulation signal to an optical modulator in accordance with the first embodiment of the present invention.

The circuit 10 is comprised of an optical modulator 1, a first stripline 2, a first terminator 3 formed on the first stripline 2, a second stripline 4, a second terminator 5 and a third terminator both formed on the second stripline 4, a first bonding wire 8 through which the optical modulator 1 and the first stripline 2 are electrically connected to each other, and a second bonding wire 9 through which the optical modulator 1 and the second stripline 4 are electrically connected to each other.

The optical modulator 1 modulates a received optical signal 31 with respect to an optical intensity, a frequency and a phase in accordance with a modulation RF (Radio Frequency) signal 33 (electric field), and outputs an optical signal 32 as a modulated optical signal.

The first and second striplines 2 and 4 are arranged sandwiching the optical modulator 1 therebetween in a line perpendicularly to an optical axis of the optical modulator. The first and second striplines 2 and 4 are electrically connected to each other through the first and second bonding wires 8 and 9 with the optical modulator 1 being electrically connected to the first and second striplines 2 and 4.

In the circuit 10 for launching a modulation signal to an optical modulator in accordance with the first embodiment, the first stripline 2 has a characteristic impedance Z01 and an effective index of refraction Nm1, and the second stripline 4 has a characteristic impedance Z02 and an effective index of refraction Nm2.

The first stripline 2 receives a modulation RF signal 33 used for modulating an optical signal 31 passing through the optical modulator 1, and then, outputs the modulation RF signal 33 to the optical modulator 1 through the first bonding wire 8. The characteristic impedance Z01 of the first stripline 2 is equal to a characteristic impedance Z0 of a line through which the modulation RF signal 33 is output.

The second stripline 4 receives the modulation RF signal 33 through the optical modulator 1 and the second bonding wire 9.

In the circuit 10 in accordance with the first embodiment, the characteristic impedance Z02 of the first stripline 4 is set different from the characteristic impedance Z01 of the first stripline. This is to ensure that the reflection of the modulation RF signal 33 remains in the second stripline 4. By allowing the reflection of the modulation RF signal 33 to remain, it is possible to cause the first, second and third terminators 3, 5 and 6 to present their advantages. In the circuit 10 in accordance with the first embodiment, the second stripline 4 is designed to have a length equal to or smaller than $C0/(4Fm \times Nm2)$ wherein Fm indicates an expected maximum frequency Fm of the modulation RF signal 33, Nm2 indicates an effective index of refraction of the second stripline 4, and C0 indicates a luminous flux. This means that an electrical length of the second stripline 4 is equal to or smaller than a quarter of a wavelength associated with a maximum frequency Fm of the modulation RF signal 33.

The first terminator 3 is arranged at an end of the first stripline 2 closer to the optical modulator 1, and defines an electrical device having an impedance of ZL1. In the first embodiment, the impedance ZL1 is set different from the characteristic impedance Z01 of the first stripline. On a surface of the first stripline 2 is formed an electrical conductor 2a extending across opposite ends of the first stripline in a length-wise direction thereof. In the first embodiment, the first terminator 3 is comprised of a thin-film resistor formed on the electrical conductor 2a.

The second and third terminators 5 and 6 are arranged at different locations on the second stripline 4 in a length-wise direction thereof, and define electrical devices having impedances ZL2 and ZL3, respectively. In the first embodiment, the second and third terminators 5 and 6 are arranged at opposite ends of the second stripline 4 in a length-wise direction thereof. On a surface of the second stripline 4 is formed an electrical conductor 4a extending across opposite ends of the second stripline 4 in a length-wise direction thereof. In the first embodiment, each of the second and third terminators 5 and 6 is comprised of a thin-film resistor formed on the electrical conductor 4a.

In the first embodiment, a parallel-combined resistance (impedance) of the three terminators (the first terminator 3, the second terminator 5 and the third terminator 6) is set equal to the characteristic impedance Z0 of a line through which the modulation RF signal 33 is output. Accordingly, in the first embodiment, the parallel-combined resistance (impedance) of the three terminators is also equal to the characteristic impedance Z01 of the first stripline 2.

It is preferable that a sum of resistances of the three terminators, the first bonding wire 8 and the second bonding wire 9 is equal to the characteristic impedance Z0. If the modulation RF signal 33 had a low frequency signal, that is, the modulation RF signal is almost a direct current, impedances of the first and second bonding wires 8 and 9 are ignorable.

The first bonding wire 8 electrically connects the first stripline 2 and the optical modulator to each other, and the second bonding wire 9 electrically connects the second stripline 4 and the optical modulator 1 to each other. In addition, the first and second bonding wires 8 and 9 are electrically connected to each other on the optical modulator 1.

An example of an optical modulator module 20 including the circuit 10 in accordance with the first embodiment is explained hereinbelow with reference to FIG. 2.

The optical modulator module 20 is comprised of a carrier 7, a first lens unit 21-1, a second lens unit 21-2, a high-frequency connector 22, a package 22, an optical input terminal 24-1, an optical output terminal 24-2, a thermal sensor 25, a circuit 27 for launching a modulation signal to an optical modulator, and a radiator 28.

The circuit 27 has the same structure as the structure of the circuit 10 in accordance with the first embodiment, illustrated in FIG. 1.

The carrier 7 is comprised of a base composed of a metal. On the carrier 7 and in the optical modulator module 20 are arranged the circuit 27, the first lens unit 21-1, the second lens unit 21-2 and the thermal sensor 25 in a predetermined positional relation.

Each of the first lens unit 21-1 and the second lens unit 21-2 is comprised of a lens and a lens holder supporting the lens therewith. Lenses of the first lens unit 21-1 and the second lens unit 21-2 are positioned on an optical axis connecting an optical waveguide of the optical modulator 1 of the circuit 27 and cores of the first and second optical fibers 26-1 and 26-2 to each other. A distance between the first and second lens units 21-1 and 21-2 and the optical modulator 1 is determined such that foci of the lenses are situated on end surfaces of the optical modulator 1 (end surfaces of the optical waveguide) through which an optical signal is input and output.

The high-frequency connector 22 electrically connects a transmission line (not illustrated) of the modulation RF signal 33 and the optical modulator module 20 to each other, and outputs the modulation RF signal 33 transmitted through the transmission line, to the first stripline 2 of the circuit 27.

The carrier 7 is mounted on an electronic cooler mounted on an inner bottom of the package 23 (since the electronic cooler is located below the carrier 7, the electronic cooler is not illustrated in FIG. 2).

The optical input terminal 24-1 optically connects the first optical fiber 26-1 and the optical modulator module 20 to each other, and the optical output terminal 24-2 optically connects the second optical fiber 26-2 and the optical modulator module 20 to each other. The optical input terminal 24-1 outputs the optical signal 31 having been transmitted through the first optical fiber 26-1, to the first lens unit 21-1 of the optical modulator module 20, and the optical output terminal 24-2 outputs the optical signal 32 having been output through the second lens unit 21-2 of the optical modulator module 20, to the second optical fiber 26-2.

The thermal sensor 25 measures a temperature in the vicinity of the circuit 27.

Bias leads 28 are electrically connected to the thermal sensor 25 and the electronic cooler.

Hereinbelow is explained an operation of the optical modulator module 20 with reference to FIGS. 1 and 2.

The modulation RF signal 33 having been transmitted through a line is output to the first stripline 2 of the circuit 27 in the optical modulator module 20 through the high-frequency connector 22. The modulation RF signal 33 having been input into the first stripline 2 through an input end of the first stripline is output to the optical modulator 1 from the first stripline 2 through the first bonding wire 8.

The optical signal 31 having been transmitted through the first optical fiber 26-1 is output to the optical modulator module 20 through the optical input terminal 24-1. The optical signal 31 is received at the first lens unit 21-1, and focused onto an end of the optical waveguide of the optical modulator 1 through the lens of the first lens unit 21-1. Then, the optical signal 31 is transmitted towards the other end of the optical waveguide through the optical waveguide of the optical modulator 1.

The optical signal 31 is modulated in accordance with the modulation RF signal 33 having been input through the first bonding wire 8, while being transmitted through the optical waveguide, and then, turned into the optical signal 32 as a modulated optical signal. The optical signal 32 is transmitted through the other end of the optical waveguide, and is received at the second lens unit 21-2. Then, the optical signal 32 is focused onto an end of the optical output terminal 24-2 through the lens of the second lens unit 21-2, and then, output to the second optical fiber 26-2 through the optical output terminal 24-2.

After having modulated the optical signal 31, the modulation RF signal 33 is transmitted to a distal end of the second stripline 4 through the optical modulator 1.

When the modulation RF signal 33 is a low-frequency signal close to a direct current, the optical modulator 1 has an almost infinite impedance (open-circuit). In addition, since the first and second bonding wires 8 and 9 have ignorable impedances, an input impedance of the circuit 27, viewed from a line through which the modulation RF signal 33 is transmitted, is almost equal to a parallel-combined resistance of the first, second and third terminators 3, 5 and 6. Hence, it would be possible in a low-frequency band to suppress the reflection of the circuit 27 down to a practically ignorable level, because a characteristic impedance of a line through which the modulation RF signal 33 is transmitted is equal to an impedance at an end (parallel-combined resistance=Z0).

In contrast, when the modulation RF signal 33 has a high frequency covering a GHz wave band to a millimeter wave band, an impedance of the optical modulator 1 acting as a capacitive load is significantly reduced. The second stripline 4 is designed to have a length equal to or smaller than $\lambda/4$ which allows primary approximation to be established for a frequency of an admittance. Hence, it is possible to consider the second stripline 4 as a matching circuit exhibiting a tendency that an admittance is decreased in proportion with a frequency (that is, an impedance is increased in proportion with a frequency). That is, a sum of impedances of the second bonding wire 9, the second stripline 4, the second terminator 5 and the third terminator 6 all arranged downstream of the optical modulator 1 compensates for the behavior of the optical modulator 1, namely, rapid reduction of an impedance of the optical modulator 1 (in other words, the sum of impedances rapidly increase), and cancels the dependency of an impedance reflecting the circuit 27 on a frequency.

Thus, the optical modulator module 20 suppresses the reflection of the circuit 27 down to a practically ignorable level in a broad range of a direct current to a maximum frequency.

Furthermore, if a conventional matching process in which a capacitor is added to the first stripline 2 is applied to the optical modulator module 20 in accordance with the first embodiment, it would be possible to further enhance the low-reflection characteristic.

EXAMPLE 1

Hereinbelow is explained an example of applying the circuit for launching a modulation signal to an optical modulator in accordance with the first embodiment to an electroabsorption type optical modulator module.

Figure 2:
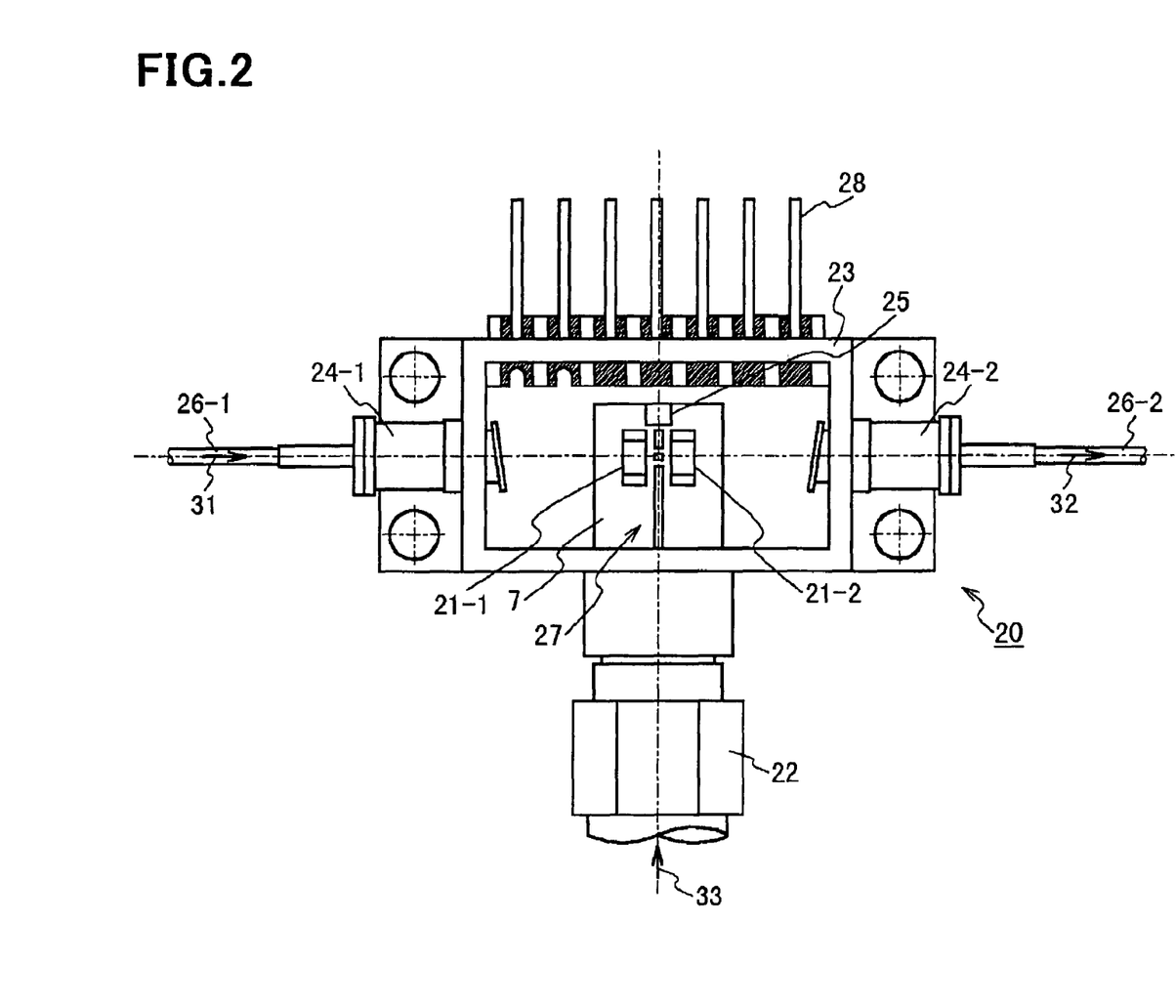
FIG. 2 is a plan view of an embodiment of an electric-field absorption type optical modulator module including the circuit for exciting an optical modulator in accordance with the first embodiment of the present invention.

FIG. 2 illustrates an electroabsorption type optical modulator module (the optical modulator module 20). Since the optical modulator module has been explained above, the parts other than the circuit 27 explained hereinbelow are not explained.

Figure 4:
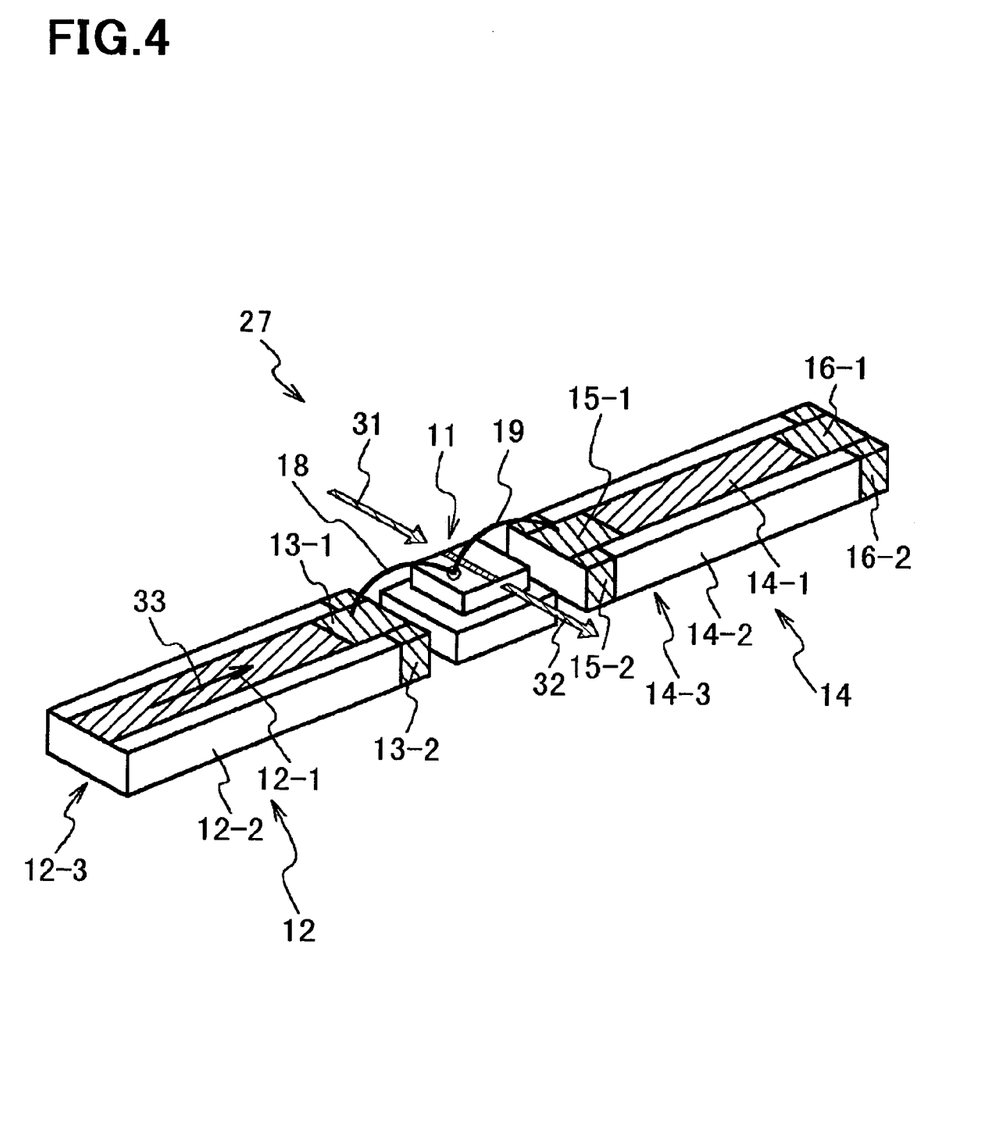
FIG. 4 is a perspective view of an example of the circuit for exciting an optical modulator in accordance with the first embodiment of the present invention.

FIG. 4 is a perspective view of the circuit 27 for launching a modulation signal to an optical modulator, applied to the electroabsorption type optical modulator module 20.

As illustrated in FIG. 4, the circuit 27 as a part of the electroabsorption type optical modulator module 20 is comprised of an optical modulator 11, a first stripline 12, a first electrical conductor 12-1 formed on an upper surface of the first stripline 12, a second electrical conductor 12-3 (not illustrated) formed on a lower surface of the first stripline 12, a first thin film 13-2 formed on upper, side and lower surfaces of the first stripline 12 at an end of the first stripline 12 closer to the optical modulator 11, and electrically connecting the first and second electrical conductors 12-1 and 12-3 to each other, a first terminator 13-1 formed on the first electrical conductor 12-1 and the first thin film 13-2 at an end of the first stripline 12 closer to the optical modulator 11, a second stripline 14, a third electrical conductor 14-1 formed on an upper surface of the second stripline 14, a fourth electrical conductor 14-3 (not illustrated) formed on a lower surface of the second stripline 14, a second thin film 15-2 formed on upper, side and lower surfaces of the second stripline 14 at an end of the second stripline 14 closer to the optical modulator 11, and electrically connecting the third and fourth electrical conductors 14-1 and 14-3 to each other, a third thin film 16-2 formed on upper, side and lower surfaces of the second stripline 14 at an end of the second stripline 14 remoter from the optical modulator 11, and electrically connecting the third and fourth electrical conductors 14-1 and 14-3 to each other, a second terminator 15-1 formed on the third electrical conductor 14-1 and the second thin film 15-2 at an end of the second stripline 14 closer to the optical modulator 11, a third terminator 16-1 formed on the third electrical conductor 14-1 and the second thin film 15-2 at an end of the second stripline 14 remoter from the optical modulator 11, a first Au ribbon wire 18 electrically connecting the optical modulator 11 and the first stripline 12 to each other, and a second ribbon wire 19 electrically connecting the optical modulator 11 and the second stripline 14 to each other.

The optical modulator 11 corresponds to the optical modulator 1 of the circuit 10 illustrated in FIG. 1. Similarly, the first stripline 12 corresponds to the first stripline 2, the first terminator 13-1 to the first terminator 3, the second stripline 14 to the second stripline 4, the second terminator 15-1 to the second terminator 5, the third terminator 16-1 to the third terminator 6, the first Au ribbon wire 18 to the first bonding wire 8, and the second Au ribbon wire 19 to the second bonding wire 9.

The first stripline 12 is comprised of a coplanar line comprised of an alumina substrate 12-2 having a dielectric constant of 9.95, a thickness of 250 micrometers, a length of 3.5 mm, and a width of 700 micrometers, and has a characteristic impedance of 50 ohms. The first thin film 13-2 electrically connecting the first electrical conductor 12-1 and the second electrical conductor 12-3 to each other is formed by metallization. The first terminator 13-1 is comprised of a thin-film resistor composed of $Ta_2N$, and has a sheet resistance of 100 ohms per a unit area and an impedance of ZL1 of 150 ohms.

Similarly, the second stripline 12 is comprised of a coplanar line comprised of an alumina substrate 14-2 having a dielectric constant of 9.95, a thickness of 250 micrometers, a length of 3.5 mm, and a width of 700 micrometers, and has a characteristic impedance of 50 ohms. Each of the second thin film 15-2 and the third thin film 16-2 both electrically connecting the second electrical conductor 14-1 and the third electrical conductor 14-3 to each other is formed by metallization. The second terminator 15-1 is comprised of a thin-film resistor composed of $Ta_2N$, and has a sheet resistance of 100 ohms per a unit area and an impedance of ZL2 of 150 ohms. Similarly, the third terminator 16-1 is comprised of a thin-film resistor composed of $Ta_2N$, and has a sheet resistance of 100 ohms per a unit area and an impedance of ZL3 of 150 ohms.

The optical modulator 11, the first stripline 12 and the second stripline 14 are arranged on the metal carrier 7 in a line perpendicularly to an optical axis of the optical modulator 11.

The first stripline 12 and the optical modulator 11 are electrically connected to each other through the first Au ribbon wire 18 as a bonding wire having an inductance of 150 pH. Similarly, the second stripline 14 and the optical modulator 11 are electrically connected to each other through the second Au ribbon wire 19 as a bonding wire having an inductance of 180 pH.

Figure 3:
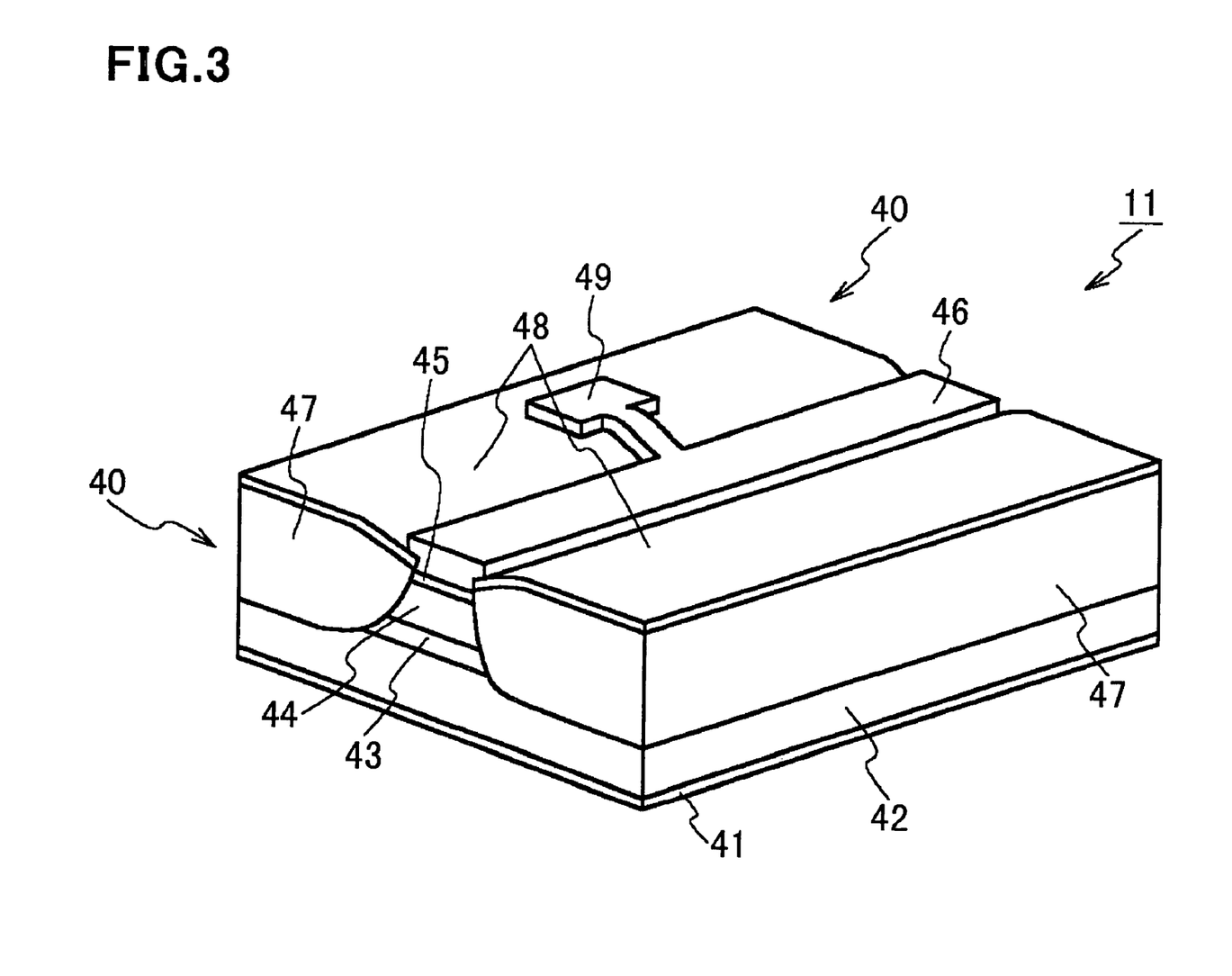
FIG. 3 is a perspective view of an optical modulator in the circuit for exciting an optical modulator in accordance with the first embodiment of the present invention.

The optical modulator 11 as a part of the electroabsorption type optical modulator module 20 is further explained hereinbelow.

FIG. 3 is a perspective view of the optical modulator 11.

The illustrated optical modulator 11 is an electrical-field absorption type optical modulator, and is comprised of a substrate 42, a first electrode 41 formed on a lower surface of the substrate 42, an optical absorption layer 43 formed almost centrally of the substrate 42 in a length-wise direction of the substrate 42, a first cladding layer 44 formed on the optical absorption layer 43, a contact layer 45 formed on the first cladding layer 44, a second electrode 46 formed on the contact layer 45, second cladding layers 47 formed around the optical absorption layer 43 and the first cladding layer 44, and an electrically insulating layer 48 formed on the second cladding layers 47.

The substrate 42 is comprised of an InP substrate.

The second cladding layers 47 are comprised of an n-InP layer formed on the substrate 42 in a region other than a region in which the optical absorption layer 43 is formed.

The optical absorption layer 43 is sandwiched between the second cladding layers 47 on the substrate 42. The optical absorption layer 43 has a width of 2 microns, and has an undoped InGaAs/InAlAs quantum well structure (the number of well layers Nw=7) having a wavelength of 1.49 micrometers. The optical absorption layer 43 acts as an optical waveguide, and allows the optical signal 31 to pass therethrough. The optical absorption layer 43 optically modulates the optical signal 31, and outputs the optical signal 32.

The first cladding layer 44 is sandwiched between the second cladding layers 47, and is comprised of a p-InP layer covering an upper surface of the optical absorption layer 43 therewith.

The contact layer 45 is sandwiched between the second cladding layers 47, and is comprised of a $p^+$-InGaAs layer covering an upper surface of the first cladding layer 44 therewith.

The second electrode 46 is sandwiched between the second cladding layers 47, and is comprised of a p-electrode having a five-layered metal structure, Cr/Au/Ti/Pt/Au, and covering an upper surface of the contact layer 45 therewith. The second electrode 46 partially extends onto the electrically insulating layer 48, and defines a connection 49 through which the first and second bonding wires 18 and 19 are connected to each other. The modulation RF signal 33 having been transmitted through the first stripline 12 is applied to the connection 49.

The electrically insulating layer 48 is formed covering surfaces of the second cladding layers 47 therewith.

The first electrode 41 is comprised of an n-electrode having a three-layered metal structure, Ti/Pt/Au.

The optical modulator 11 has an element length of 300 micrometers, and is formed on opposite cleavage surfaces 40 thereof with low-reflection films (not illustrated) having an index of refraction of 0.1% or smaller. The optical modulator 11 has an element capacity of 125 fF when a reverse-bias voltage of −2V is applied thereto.

Figure 5:
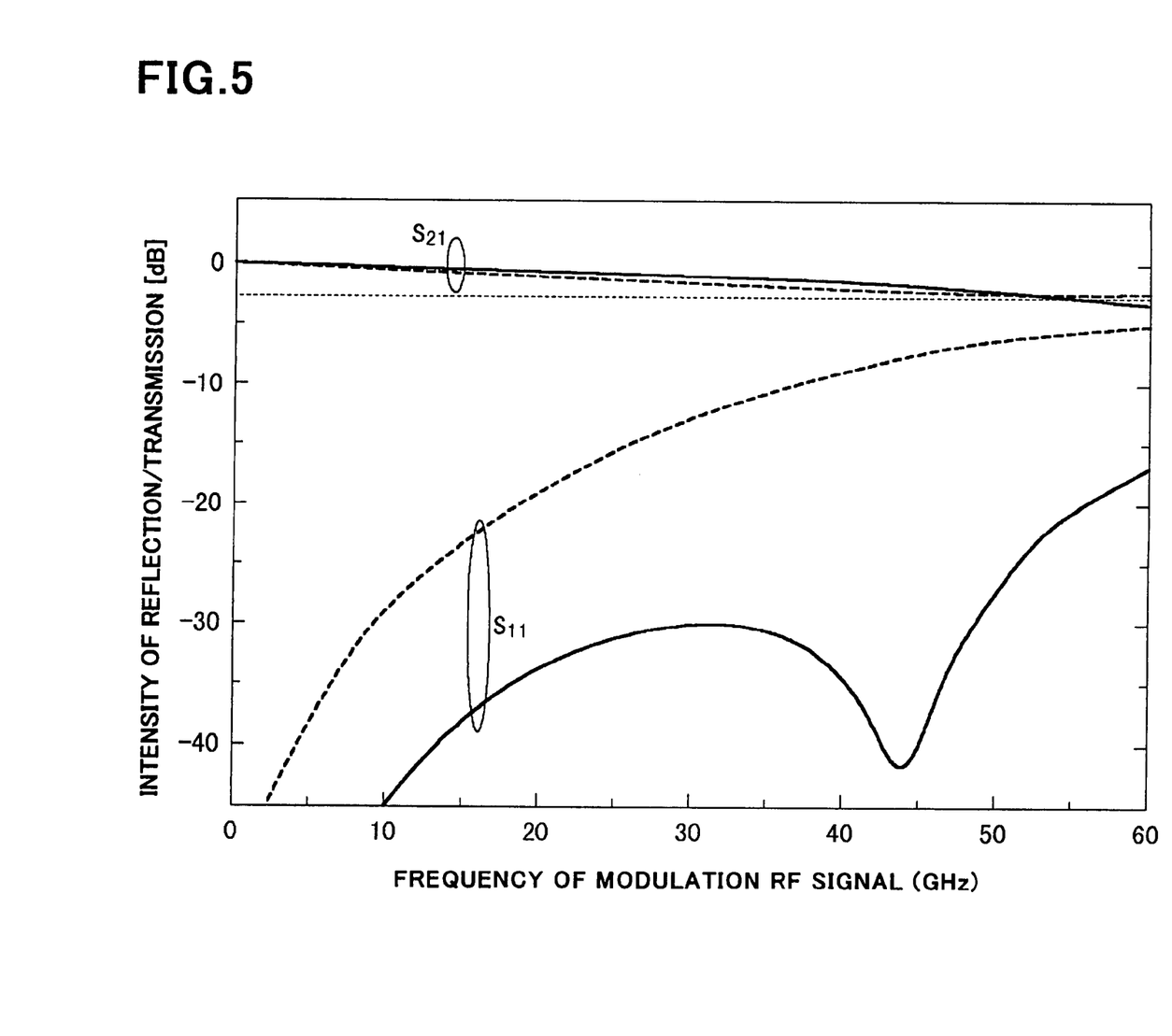
FIG. 5 is a graph showing the measurement results of a relation between a frequency and reflection in a circuit for exciting an optical modulator.

FIG. 5 is a graph showing the results of measurement of a relation (frequency-response characteristic) between a frequency and a signal intensity of the modulation RF signal 33 in the circuit 27 illustrated in FIG. 4. The axis of abscissa indicates a frequency of the input modulation RF signal 33, and the axis of ordinates indicates an intensity of reflection or transmission. The solid line indicates the measurement results obtained when the circuit 27 illustrated in FIG. 4 is used, and the broken line indicates the measurement results obtained when a conventional circuit for launching a modulation signal to an optical modulator is used.

Applying a reverse-bias of −2V to the electroabsorption type optical modulator 11, the reflection and transmission reflecting the optical modulator 11 and a circuit for launching a modulation signal to the optical modulator 11 were measured for the input modulation RF signal 33. As shown with a curve (solid line) indicating the reflection S11, it was found out that the reflection wave was suppressed down to a slight degree, specifically, −15 dB or smaller, when the modulation RF signal 33 had a frequency in the range of zero (direct current) and 60 GHz.

When a signal light having a wavelength of 1550 nm was input into the optical modulator 11 of the circuit 27, a modulation frequency band (transmission S21: −3 dB or greater) became 50 GHz or greater. Thus, it was found out that there was obtained a broad-band optical modulation characteristic practically sufficient for accomplishing 40 GHz optical-fiber communication.

EXAMPLE 2

Hereinbelow is explained another example of applying the circuit 27 for launching a modulation signal to an optical modulator, illustrated in FIG. 4, to an electroabsorption type optical modulator module.

FIG. 2 is an exploded plan view of the electroabsorption type optical modulator module 20 including the circuit 27 for launching a modulation signal to an optical modulator, illustrated in FIG. 4. The electroabsorption type optical modulator module 20 has the same structure as that of the electroabsorption type optical modulator module explained in Example 1. The carrier 7 is composed of Fe—Ni—Co alloy unlike the carrier 7 in Example 1.

Similarly to the Example 1, applying a reverse-bias of −2V to the electroabsorption type optical modulator 11, the reflection of the optical modulator 11 and a circuit for launching a modulation signal to the optical modulator 11 were measured for the input modulation RF signal 33. The reflection wave was suppressed down to a slight degree, specifically, −15 dB or smaller, when the modulation RF signal 33 had a frequency in the range of zero (direct current) and 40 GHz.

When a signal light having a wavelength of 1550 nm was input into the optical modulator 11 of the circuit 27, a modulation frequency band became 50 GHz or greater. Thus, it was found out that there was obtained a broad-band optical modulation characteristic practically sufficient for accomplishing 40 GHz optical-fiber communication.

When the optical modulator module 20 is reduced into practice, it is important to determine tolerances for parameters of circuit elements in order to avoid variance in dimensions and resistances caused in fabrication of the optical modulator module 20 from exerting harmful influence on the modulation characteristics.

Figure 6:
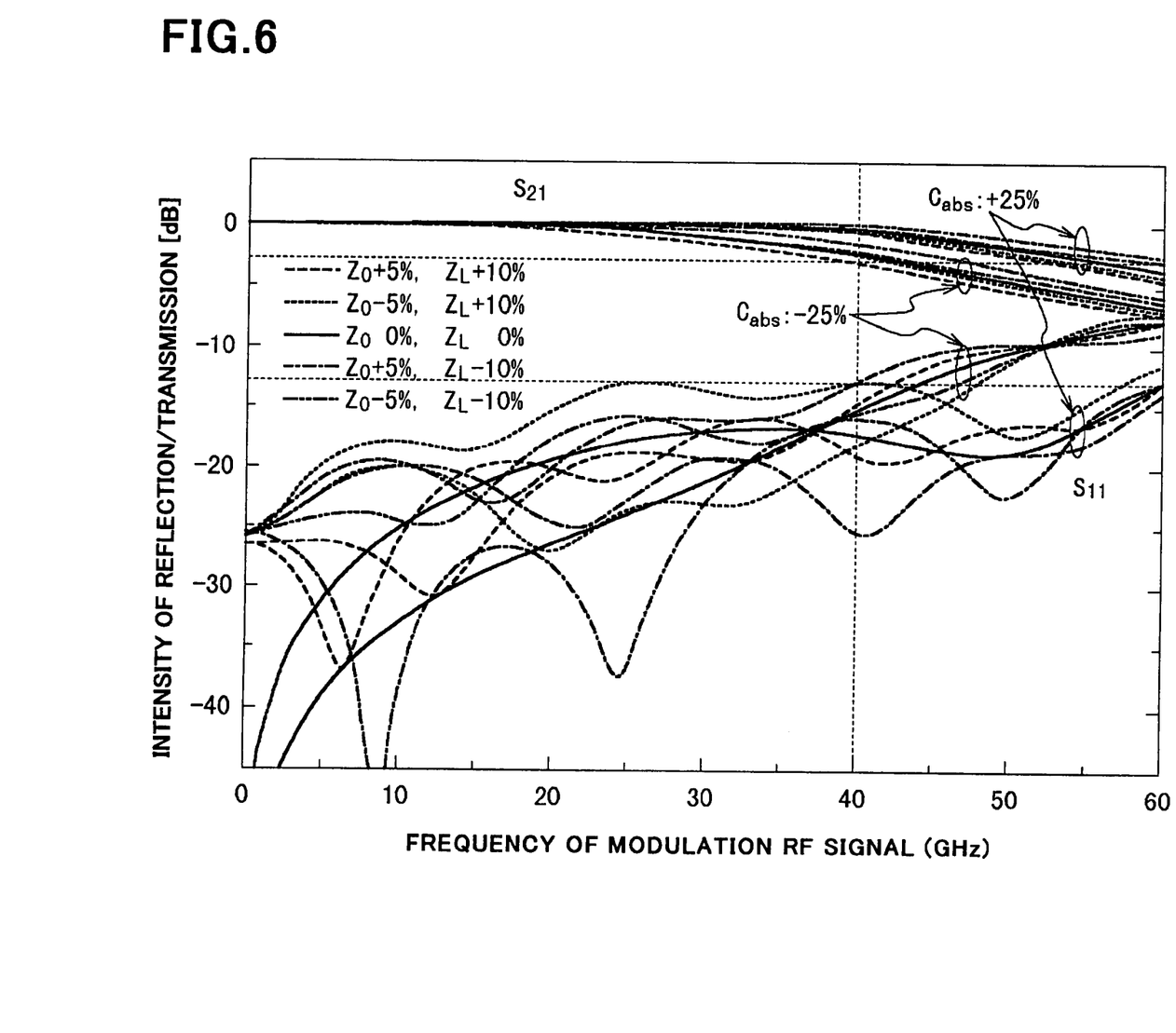
FIG. 6 is a graph showing the measurement results of a relation between a frequency and reflection in a circuit for exciting an optical modulator.

FIG. 6 is a graph showing the results of measurement of a relation (frequency-response characteristic) between a frequency and a signal intensity of the modulation RF signal 33 in the circuit 27 in Example 2. The axis of abscissa indicates a frequency of the input modulation RF signal 33, and the axis of ordinates indicates an intensity of reflection or transmission. The curves illustrated in FIG. 6 indicate reflection and transmission found when the characteristic impedance Z0 of a line through which the modulation RF signal 33 is input varies within ±5%, when a sum of resistances of the terminators varies within ±10%, and when a capacity Cabs of the optical modulator 11 varies within ±25%.

As illustrated in FIG. 6, even when the characteristic impedance of each of the striplines, the resistances of the terminators and the capacity of the optical modulator vary within ±5%, ±10% and ±25%, respectively, the reflection S11 of the circuit 27 for launching a modulation signal to an optical modulator is kept at −13 dB or smaller.

Furthermore, a modulation frequency band (transmission S21: −3 dB or greater) is equal to or greater than 37 GHz. Thus, it was found out that there was obtained a practically sufficient broad-band and low-reflection optical modulation characteristic.

As having been explained so far, the circuit for launching a modulation signal to an optical modulator, an optical modulator module and a method of launching a modulation signal to an optical modulator all in accordance with the present invention provide the following advantages.

The first advantage is that it is possible to significantly reduce the reflection of a circuit for launching a modulation signal to an optical modulator, down to a practically ignorable level in a high-frequency band close to a millimeter wave band, and to broaden a band of a modulation characteristic.

This is because the circuit for launching a modulation signal to an optical modulator, including terminators in a dispersion manner, can independently optimize upper and lower limits of an impedance of a matching circuit, by controlling dependency of behavior of the optical modulator as a capacitor on a frequency.

The second advantage is that it is possible to reduce a burden acting on a driver circuit for driving an optical modulator and an optical modulator module including an optical device in which optical modulators are integrated, ensuring that the driver circuit can be fabricated to have a broader band, fabricated to be in a smaller size, fabricated to operate at a smaller voltage, and fabricated in smaller costs.

The reason is as follows. Since it is possible to significantly reduce the reflection of a circuit for launching a modulation signal to an optical modulator, down to a practically ignorable level in a broad range, as mentioned in the first advantage, it would be possible to drive an optical modulator module at a smaller voltage (current), resulting in that a burden acting on the circuit elements can be reduced, designability of selecting elements and fabricating a circuit for broadening a band is enhanced, and power consumption can be reduced.

The third advantage is that it is possible to fabricate in smaller costs an optical modulator and an optical modulator module including an optical device in which optical modulators are integrated.

The reason is as follows. Since the circuit for launching a modulation signal to an optical modulator in accordance with the present invention can be fabricated merely by applying minimum change, that is, addition of thin-film resistors constituting terminators, to striplines in a conventional circuit for launching a modulation signal to an optical modulator, it would be possible to use an existing equipment for fabricating the circuit, and a conventional process for doing the same, though a mask pattern for fabricating thin-film resistors is necessary to be partially revised. Thus, further costs for accomplishing the above-mentioned first and second advantages can be avoided.

In a conventional high-speed optical modulator used for an optical-fiber communication system, and a conventional optical modulator module including an optical device in which optical modulators are integrated, when they are driven, the significant increase in reflection in a high-frequency band was a serious problem. The circuit for launching a modulation signal to an optical modulator in accordance with the present invention solves the serious problem by applying a function of matching waves of a signal light to end surfaces of an optical waveguide circuit during fabrication of the optical waveguide circuit, without using any additional optical parts. Thus, a hybrid integrated optical modulator module can be fabricated in a smaller size, with higher performances, and at a smaller cost.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-066620 filed on Mar. 12, 2002 including specification, claims, drawings and summary is incorporated herein by reference in its entirety.

The invention claimed is:

1. A circuit for launching a modulation signal to an optical modulator, comprising:
an optical modulator for modulating an optical signal;
a first stripline electrically connected to said optical modulator and directing a modulation RF signal to said optical modulator; and
a second stripline electrically connected to said first stripline through said optical modulator,
wherein said first stripline includes a first electrical device and has a first characteristic impedance,
said second stripline includes a second electrical device and has a second characteristic impedance,
said first characteristic impedance is equal to a characteristic impedance of a path through which said modulation RF signal is input into said first stripline, and
a parallel-combined impedance of said first and second electrical devices is equal to said characteristic impedance of said path.

2. The circuit as set forth in claim 1, wherein said second electrical device is comprised of at least two electrical devices, which are arranged at different locations from each other in a length-wise direction of said second stripline.

3. The circuit as set forth in claim 2, wherein said at least two electrical devices are arranged at opposite ends of said second stripline.

4. The circuit as set forth in claim 1, wherein at least on of said first and second electrical devices is comprised of a resistor.

5. The circuit as set forth in claim 4, wherein said resistor is comprised of a thin-film resistor formed on an electrical conductor of said second stripline.

6. The circuit as set forth in claim 1, wherein said second stripline has an electrical length equal to or smaller than a quarter of a wavelength associated with a maximum frequency of said modulation RF signal.

7. The circuit as set forth in claim 1, wherein said second characteristic impedance is different from said first characteristic impedance.

8. The circuit as set forth in claim 1, wherein said first electrical device has an impedance different from said first characteristic impedance.

9. An optical modulator module comprising:
a high-frequency input section for receiving a modulation RF signal by which an optical signal is modulated;
an optical input section for receiving a first optical signal;
a circuit for launching a modulation signal to an optical modulator, electrically connected to said high-frequency input section and optically connected to said optical input section, said circuit modulating said first optical signal into a second optical signal in accordance with said modulation RF signal, said circuit being comprised of a circuit defined in any one of claims 1 to 8, and
an optical output section optically connected to said circuit and outputting said second optical signal.

10. The optical modulator module as set forth in claim 9, wherein said optical input section is comprised of:
an optical input terminal through which an optical signal is input and output; and
a first lens,
and wherein
said optical input terminal is connected to a first optical fiber, receives said first optical signal through said first optical fiber, and outputs said first optical signal to said first lens, and
said first lens receives said first optical signal and outputs said first optical signal to said optical modulator of said circuit.

11. The optical modulator module as set forth in claim 9, wherein said optical output section is comprised of:
a second lens; and
an optical output terminal through which an optical signal is input and output,
and wherein
said second lens receives said second optical signal from said optical modulator of said circuit, and outputs said second optical signal to said optical output terminal, and
said optical output terminal is connected to a second optical fiber, receives said second optical signal through said second lens, and outputs said second optical signal to said second optical fiber.

12. A method of launching a modulation signal to an optical modulator, comprising:
outputting a modulation RF signal to an optical modulator through a first stripline including a first electrical device and having a first characteristic impedance;
modulating a first optical signal into a second optical signal in said optical modulator in accordance with said modulation RF signal; and
outputting said modulation RF signal through said optical modulator to a second stripline including a second electrical device and having a second characteristic impedance,
wherein
said first characteristic impedance is equal to a characteristic impedance of a path through which said modulation RF signal is input into said first stripline, and
a parallel-combined impedance of said first and second electrical devices is equal to said characteristic impedance of said path.

* * * * *

UNITED STATES PATENT AND TRADEMARK OFFICE
CERTIFICATE OF CORRECTION

| | | |
|---|---|---|
| PATENT NO. | : 7,023,599 B2 | Page 1 of 1 |
| APPLICATION NO. | : 10/507246 | |
| DATED | : April 4, 2006 | |
| INVENTOR(S) | : Tomoaki Kato | |

It is certified that error appears in the above-identified patent and that said Letters Patent is hereby corrected as shown below:

Col 17, line 34, (claim 4) delete "on", insert --one--

Signed and Sealed this

Twenty-ninth Day of August, 2006

JON W. DUDAS
*Director of the United States Patent and Trademark Office*